United States Patent
Liou et al.

(10) Patent No.: US 9,779,980 B2
(45) Date of Patent: *Oct. 3, 2017

(54) UNIFORM SHALLOW TRENCH ISOLATION REGIONS AND THE METHOD OF FORMING THE SAME

(71) Applicant: Taiwan Semiconductor Manufacturing Company, Ltd., Hsin-Chu (TW)

(72) Inventors: Yu-Ling Liou, Taoyuan (TW); Chih-Tang Peng, Zhubei (TW); Pei-Ren Jeng, Hsin-Chu (TW); Hao-Ming Lien, Hsin-Chu (TW); Tze-Liang Lee, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/860,014

(22) Filed: Sep. 21, 2015

(65) Prior Publication Data
US 2016/0013095 A1    Jan. 14, 2016

Related U.S. Application Data

(62) Division of application No. 13/307,847, filed on Nov. 30, 2011, now Pat. No. 9,142,402.

(51) Int. Cl.
| H01L 21/762 | (2006.01) |
| H01L 21/8234 | (2006.01) |
| H01L 21/02 | (2006.01) |
| H01L 21/3115 | (2006.01) |

(52) U.S. Cl.
CPC .. *H01L 21/76237* (2013.01); *H01L 21/02164* (2013.01); *H01L 21/02304* (2013.01); *H01L 21/02315* (2013.01); *H01L 21/76224* (2013.01); *H01L 21/823431* (2013.01); *H01L 21/823481* (2013.01); *H01L 21/31155* (2013.01)

(58) Field of Classification Search
CPC .................................................. H01L 21/02164
See application file for complete search history.

(56) References Cited

U.S. PATENT DOCUMENTS

| 7,413,943 | B2 | 8/2008 | Kim et al. |
| 7,842,566 | B2 | 11/2010 | Lee et al. |
| 8,679,960 | B2 | 3/2014 | Papasouliotis et al. |
| 9,142,402 | B2 * | 9/2015 | Liou ................ H01L 21/76224 |
| 2005/0280115 | A1 | 12/2005 | Wise et al. |

(Continued)

FOREIGN PATENT DOCUMENTS

| KR | 100652419 | 11/2006 |
| KR | 100836761 | 6/2008 |

(Continued)

*Primary Examiner* — Alexander Ghyka
(74) *Attorney, Agent, or Firm* — Slater Matsil, LLP

(57) ABSTRACT

A method includes performing a plasma treatment on a first surface of a first material and a second surface of a second material simultaneously, wherein the first material is different from the second material. A third material is formed on treated first surface of the first material and on treated second surface of the second material. The first, the second, and the third materials may include a hard mask, a semiconductor material, and an oxide, respectively.

17 Claims, 14 Drawing Sheets

(56) References Cited

U.S. PATENT DOCUMENTS

2009/0203189 A1 8/2009 Shin et al.
2009/0325356 A1 12/2009 Shin et al.
2011/0159673 A1 6/2011 Hanawa et al.

FOREIGN PATENT DOCUMENTS

KR 101030974 5/2011
TW 201123274 7/2011

* cited by examiner

UNIFORM SHALLOW TRENCH ISOLATION REGIONS AND THE METHOD OF FORMING THE SAME

PRIORITY CLAIM AND CROSS-REFERENCE

This application is a divisional of U.S. patent application Ser. No. 13/307,847, entitled "Uniform Shallow Trench Isolation Regions and the Method of Forming the Same," filed on Nov. 30, 2011, which application is incorporated herein by reference.

BACKGROUND

With the increasing down-scaling of integrated circuits and increasingly demanding requirements to the speed of integrated circuits, transistors need to have higher drive currents with increasingly smaller dimensions. Fin Field-Effect Transistors (FinFETs) were thus developed.

In the existing formation process of FinFETs, Shallow Trench Isolation (STI) regions are first formed in a semiconductor substrate. The STI regions are then recessed. As a result, a portion of the semiconductor substrate between two neighboring STI regions is over the top surfaces of the recessed STI regions. This portion of the semiconductor substrate thus forms a semiconductor fin, on which a FinFET is formed.

It was found that the STI regions may have a non-uniform property. For example, the upper portions of the STI regions often have a greater etching rate than the lower portions. This results in the difficulty in the control of the etching of the STI regions. Existing methods for reducing the etching rates of the upper portions of the STI regions include thermal anneal. However, the thermal anneal requires extra thermal budget, and may cause the wafer warpage.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Methods for forming Shallow Trench Isolation (STI) regions and Fin Field-Effect Transistor (FinFET) are provided. The intermediate stages in the manufacturing of the STI regions and FinFETs in accordance with some embodiments are illustrated. The variations of the embodiments are discussed. Throughout the various views and illustrative embodiments, like reference numbers are used to designate like elements. It is appreciated that although the exemplary embodiments are regarding the formation of STI regions, the concept of the embodiments may be applied on the formation of any other material (a first material) on the surfaces of two different materials (a second and a third material), so that the uniformity in the property of the second and the third materials may be more uniform. Accordingly, the property of the first material may be more uniform.

Figure 1:
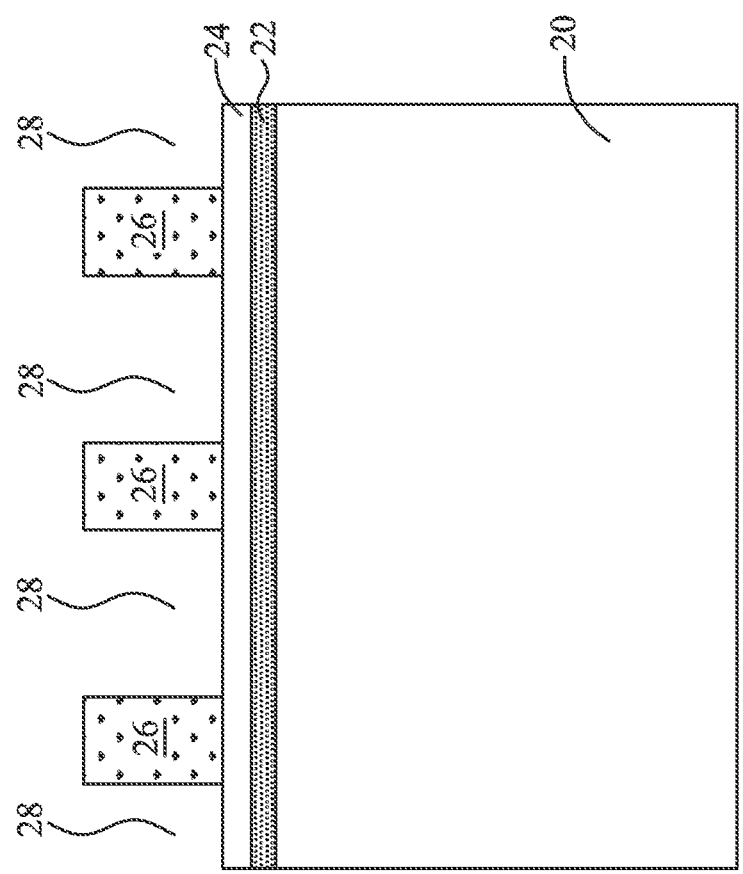
FIGS. 1, 2, 3A, 3B, 4A, 4B, 5A, 5B, 6A, 6B, 6C, 7A, 7B, and 7C are cross-sectional views of intermediate stages in the manufacturing of Shallow Trench Isolation (STI) regions and Fin Field-Effect Transistors (FinFET) in accordance with various exemplary embodiments.

Referring to FIG. 1, semiconductor substrate 20 is provided. In some embodiments, semiconductor substrate 20 includes crystalline silicon. Other materials such as carbon, germanium, gallium, arsenic, nitrogen, indium, phosphorus, and the like, may also be included in semiconductor substrate 20. Semiconductor substrate 20 may be a bulk substrate or a semiconductor-on-insulator (SOI) substrate.

Pad layer 22 and mask layer 24 may be formed on semiconductor substrate 20. Pad layer 22 may be a thin film comprising silicon oxide, which may be formed, for example, using a thermal oxidation process. Pad layer 22 may act as an adhesion layer between semiconductor substrate 20 and mask layer 24. Pad layer 22 may also act as an etch stop layer for etching mask layer 24. In some embodiments, mask layer 24 comprises silicon nitride formed using Low-Pressure Chemical Vapor Deposition (LPCVD). In other embodiments, mask layer 24 is formed by thermal nitridation of silicon, Plasma Enhanced Chemical Vapor Deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 2:
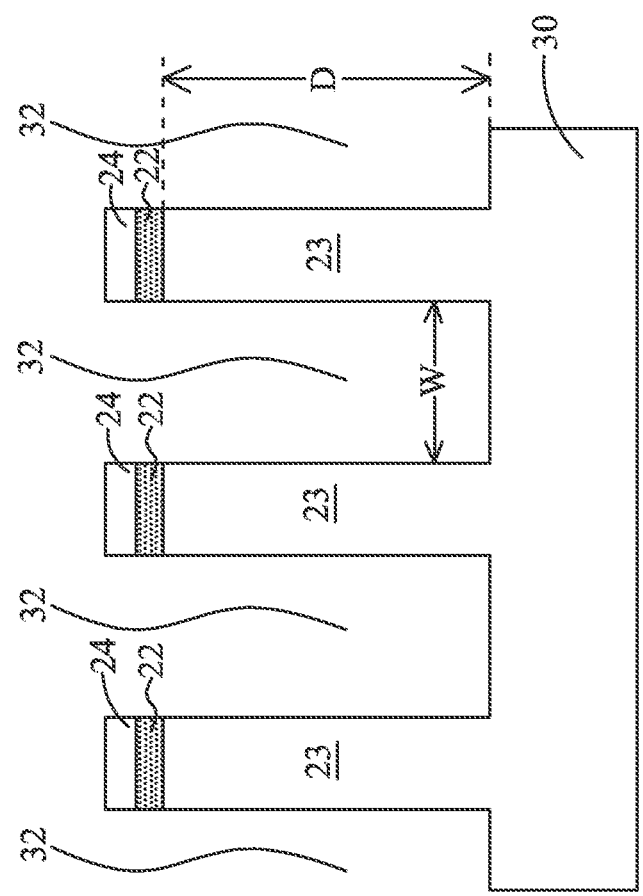

Referring to FIG. 2, mask layer 24 and pad layer 22 are etched through openings 28, exposing underlying semiconductor substrate 20. The exposed semiconductor substrate 20 is then etched, forming trenches 32. The portions of semiconductor substrate 20 between trenches 32 form semiconductor strips 23. Trenches 32 may be strips (in the top view) parallel to each other, and closely located from each other. Photo resist 26 is then removed. Next, a cleaning may be performed to remove a native oxide of semiconductor substrate 20. The cleaning may be performed using diluted hydrofluoric (HF) acid.

Depth D of trenches 32 may be between about 2100 Å and about 2500 Å, while width W may be between about 300 Å and about 1500 Å. In some exemplary embodiments, the aspect ratio (D/W) of trenches 32 is greater than about 7.0. One skilled in the art will realize, however, that the dimensions and values recited throughout the descriptions are merely examples, and may be changed to suit different scales of integrated circuits.

Figure 3A:
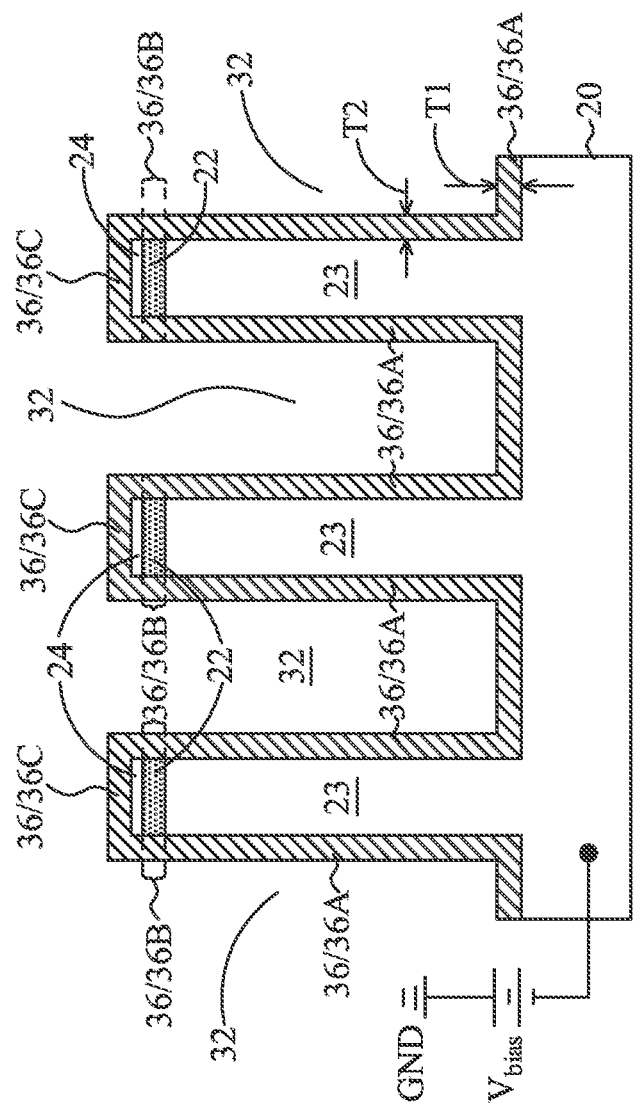
Figure 3B:
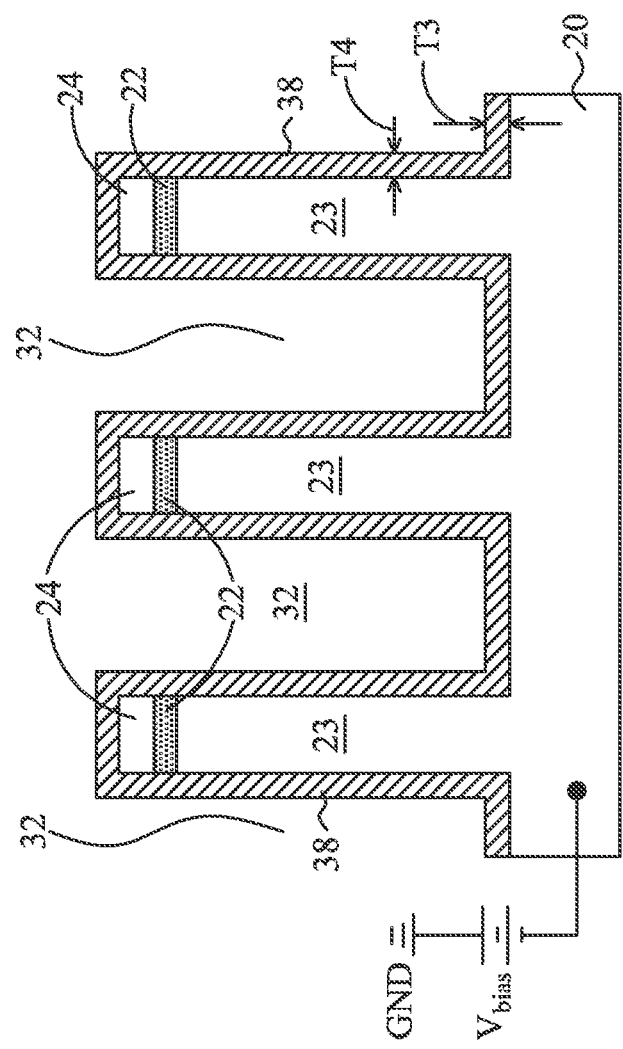

Referring to FIGS. 3A and 3B, a plasma treatment is performed to treat the exposed surfaces of the structure shown in FIG. 2. In some embodiments, the process gas, from which the plasma is generated, is selected from the group consisting essentially of $CH_4$, $N_2$, $N_2O$, $NH_3$, $NF_3$, $O_2$, $H_2$, $BF_3$, $B_2H_6$, $PH_3$, $AsH_3$, and combinations thereof. During the plasma treatment, a power source (not show), for example, a radio-frequency (RF) power source, may be provided to generate the plasma from the process gas. Substrate 20 may be connected to DC bias Vbias, so that the ions of the process gas may be attracted to the exposed surfaces of semiconductor substrate 20, pad layer 22, and mask layer 24. During the plasma treatment, the DC bias Vbias may be smaller than about 50 kV. To apply the DC bias Vbias, substrate 20 may be connected to the negative end of DC bias Vbias, while the electrical ground GND serves as the positive end. Accordingly, substrate 20 may be negatively biased. In some exemplary embodiments, during the plasma treatment, substrate 20 is at a temperature between about 0° C. and about 500° C. The flow rate of the process gas may be smaller than about 1,000 sccm.

During the plasma treatment, the elements (in the form of ions) of the process gas may be implanted into, and may also be deposited on, the exposed regions as in FIG. 2. In some embodiments, the implantation and the deposition may occur at the same time, with neither of the implantation and the deposition dominates the plasma treatment. Alternatively, one of the implantation and the deposition dominates the plasma treatment. The DC bias Vbias may affect whether the implantation dominates or the deposition dominates. When the amplitude of DC bias Vbias is greater than a threshold value, the implantation may dominate, while when the amplitude of DC bias Vbias reduces, the deposition effect becomes stronger and the implantation effect becomes weaker. Eventually, when the amplitude of DC bias Vbias is small enough, the deposition effect dominates. In an exemplary embodiment, the threshold value may be at around 1.5 kV. It is realized that the threshold value may vary depending on various factors, including, but not limited to, the type of the process gas, the type of the production tool for performing the plasma treatment, and the like.

Referring to FIG. 3A, when the implantation effect dominates the plasma treatment, a surface layer of each of mask layer 24, pad layer 22, and exposed semiconductor substrate 20 is implanted with the elements of a process gas. In some embodiments, substantially no deposition occurs. The resulting implanted surface layer is denoted as layer 36. Thickness T1 and T2 of surface layer 36 may be between about 5 Å and 100 Å, although different thicknesses may also be resulted. In the illustrated embodiments, surface layer 36 includes portions 36A, 36B, and 36C. Portions 36A are the implanted surface layer portions of semiconductor substrate 20. Portions 36B are the implanted surface layer portions of pad layer 22. Portions 36C are the implanted surface layer portions of mask layer 24. Surface layer portions 36A comprise the material of semiconductor substrate 20 and the elements in the process gas. Surface layer portions 36B comprise the material of pad layer 22 and the elements in the process gas. Surface layer portions 36C comprise the material of mask layer 24 and the elements in the process gas.

Referring to FIG. 3B, when the deposition effect dominates the plasma treatment, layer 38 is deposited on the surface of each of mask layer 24, pad layer 22, and semiconductor substrate 20. In some embodiments, substantially no implantation occurs, and hence layer 38 comprises the elements in the process gas, which may comprises C, H, N, O, F, B, P, As, and combinations thereof. The thicknesses T3 and T4 of layer 38 may be between about 5 Å and 100 Å, although different thicknesses may also be resulted. It is noted that although some of the elements may be deposited initially, in the subsequent thermal process, some of the elements may outgas. For example, when the process comprises $CH_4$, the resulting layer 38 may comprise carbon and hydrogen. However, hydrogen may outgas in the subsequent thermal process, while carbon may remain.

During the plasma treatment, when neither of the deposition and the implantation dominates, layer 36 as in FIG. 3A may be covered by layer 38 as shown in FIG. 3B.

It is realized that in the plasma treatment, the ions of the process gas are not substantially accelerated before they reach mask layer 24, pad layer 22, and semiconductor substrate 20. Accordingly, the implantation and the deposition are substantially isotropic. Alternatively stated, the implantation to vertical surfaces may have a first rate, the implantation to opposite horizontal surfaces of mask layer 24, pad layer 22, and semiconductor substrate 20 may have second rates, and the first and the second rates may be substantially equal to each other. Similarly, the deposition rates on vertical surfaces and horizontal surfaces (as in FIGS. 3A and 3B) of mask layer 24, pad layer 22, and semiconductor substrate 20 are substantially equal to each other. As a result, layers 36 (FIG. 3A) and 38 (FIG. 3B) are substantially conformal. In some exemplary embodiments, thicknesses T1 and T2 (FIG. 3A) are substantially close to each other, and may have a difference smaller than about 20 percent, or smaller than about 10 percent, of either of thickness T1 and T2. Similarly, thicknesses T3 and T4 (FIG. 3B) are substantially close to each other, and may have a difference smaller than about 20 percent, or smaller than about 10 percent, of either of thickness T3 and T4.

Figure 4A:
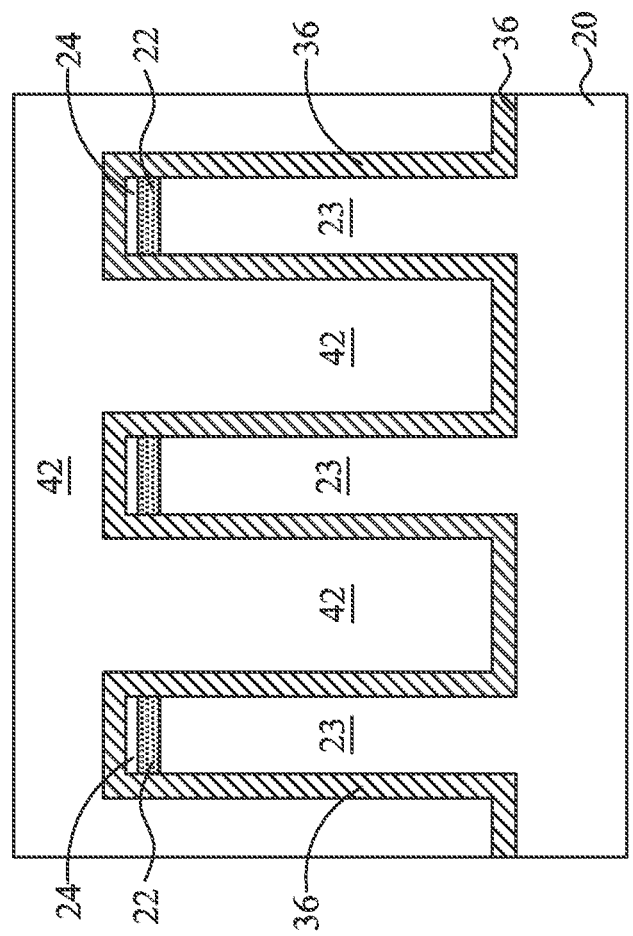
Figure 4B:
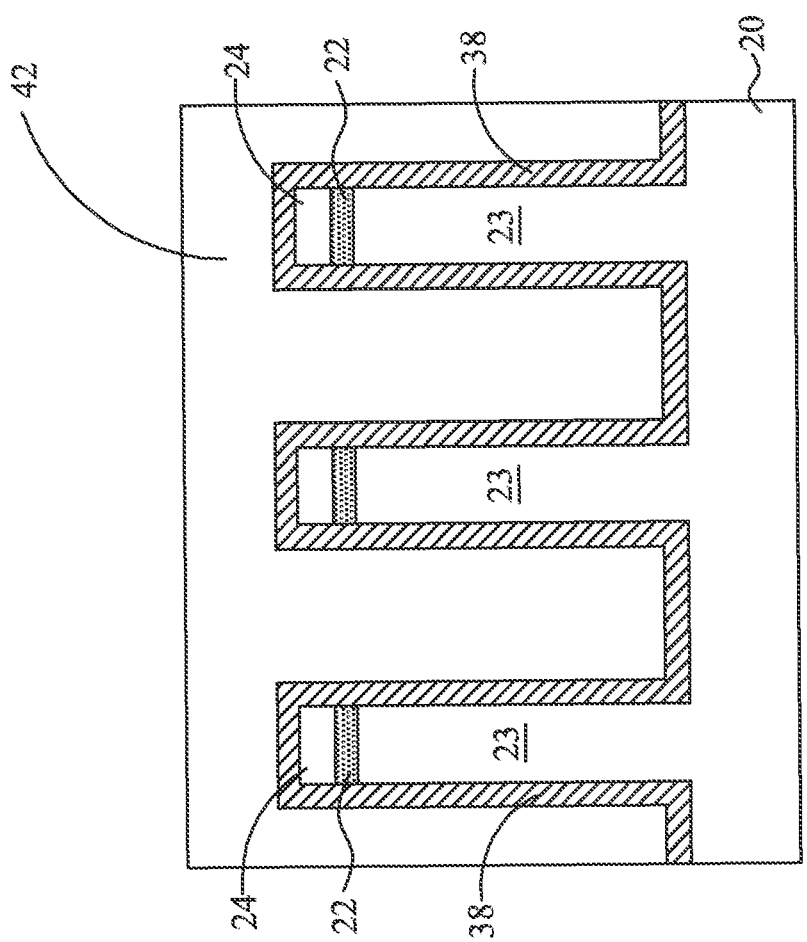

Referring to FIGS. 4A and 4B, trenches 32 are filled with dielectric material 42. The structure shown in FIG. 4A is obtained from the structure shown in FIG. 3A, while the structure shown in FIG. 4B is obtained from the structure shown in FIG. 3B. Dielectric material 42 may include silicon oxide, and hence is referred to as oxide 42 hereinafter, although other dielectric materials, such as SiN, SiC, and the like, may also be used. In some embodiments, oxide 42 may be formed by filling reflowable silicon oxide into trenches 32. A curing process is performed to convert the reflowable silicon oxide to solid. Oxide 42 may also be formed using a high aspect-ratio process (HARP), wherein the corresponding process gases may include tetraethyl orthosilicate (TEOS) and $O_3$ (ozone).

Figure 5A:
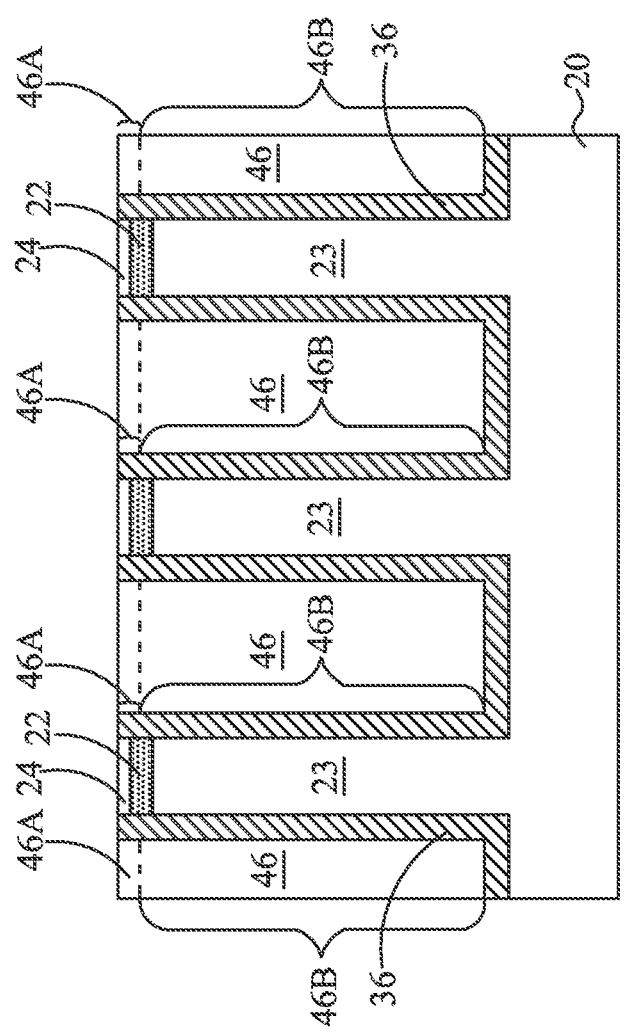
Figure 5B:
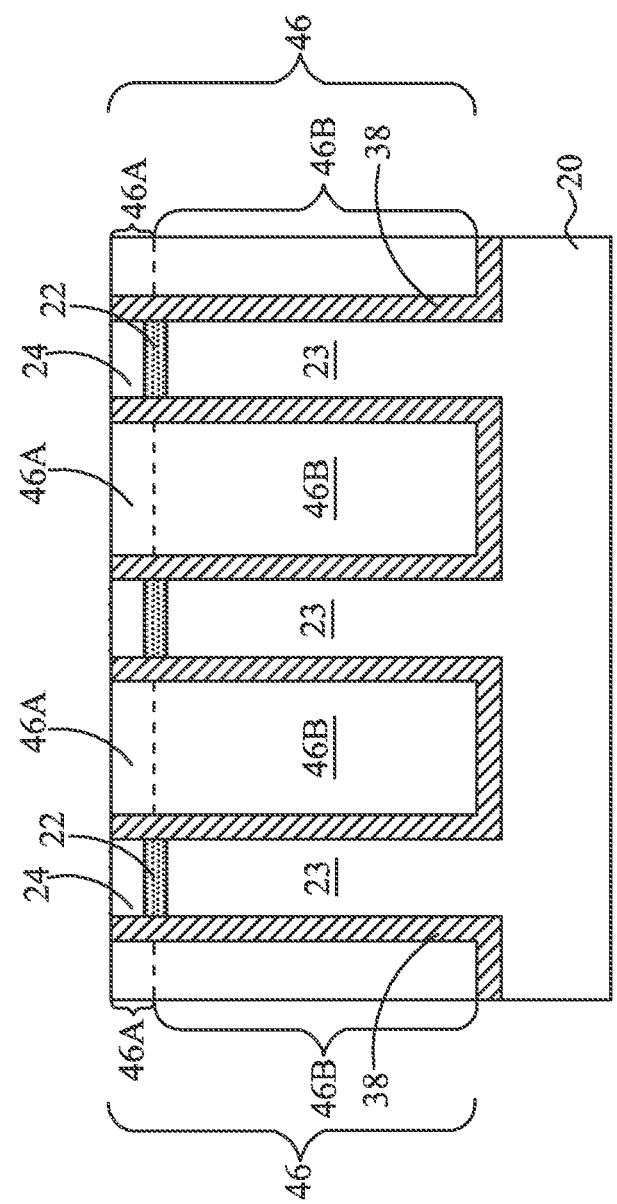

A Chemical Mechanical Polish (CMP) is then performed to remove excess oxide 42. The portions of oxide 42 over mask layer 24 are removed. The resulting structure is shown in FIGS. 5A and 5B, wherein the structure shown in FIG. 5A is obtained from the structure shown in FIG. 4A, and the structure shown in FIG. 5B is obtained from the structure shown in FIG. 4B. The remaining portions of oxide 42 in trenches 32 are referred to as STI regions 46 hereinafter.

Figure 6A:
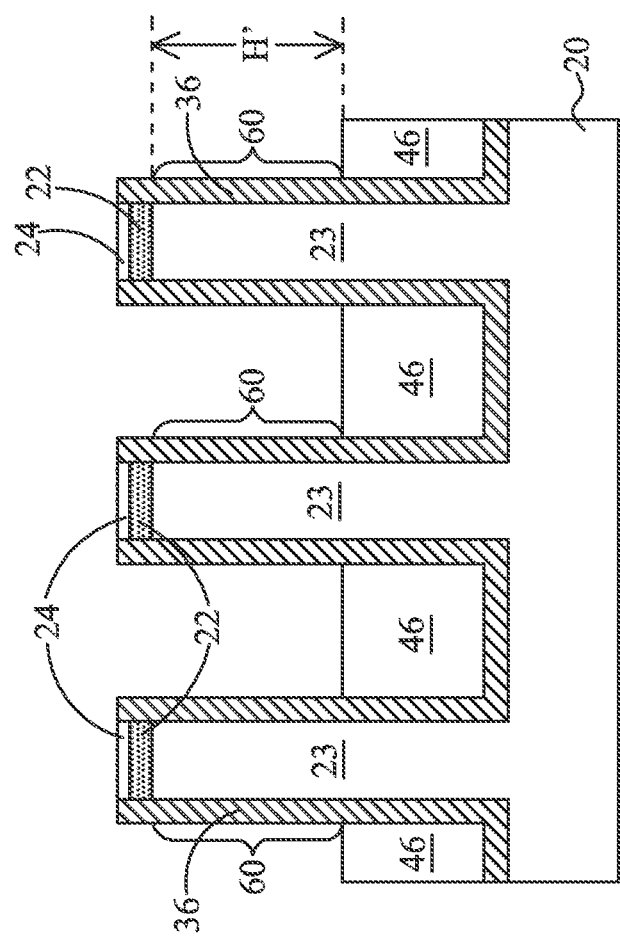
Figure 6B:
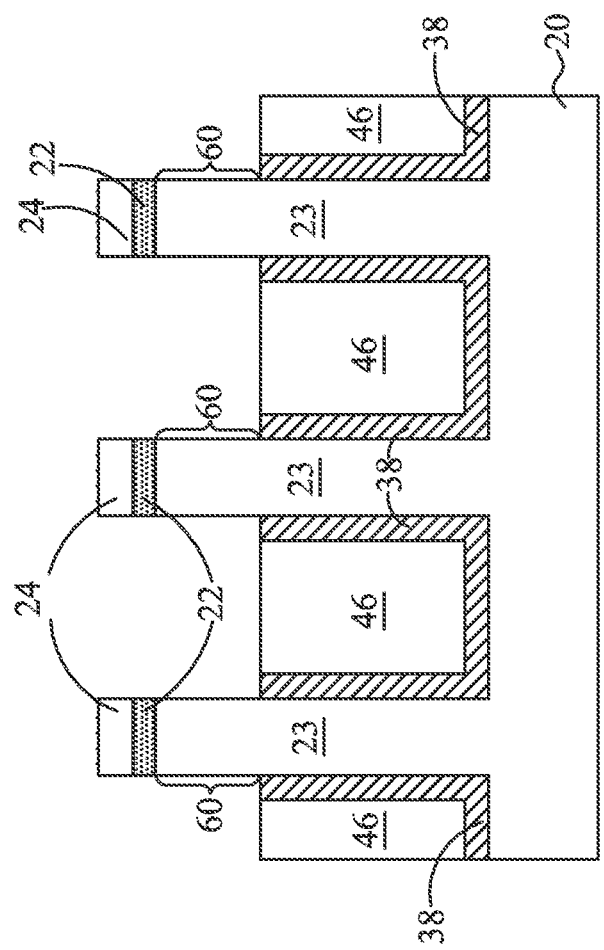
Figure 6C:
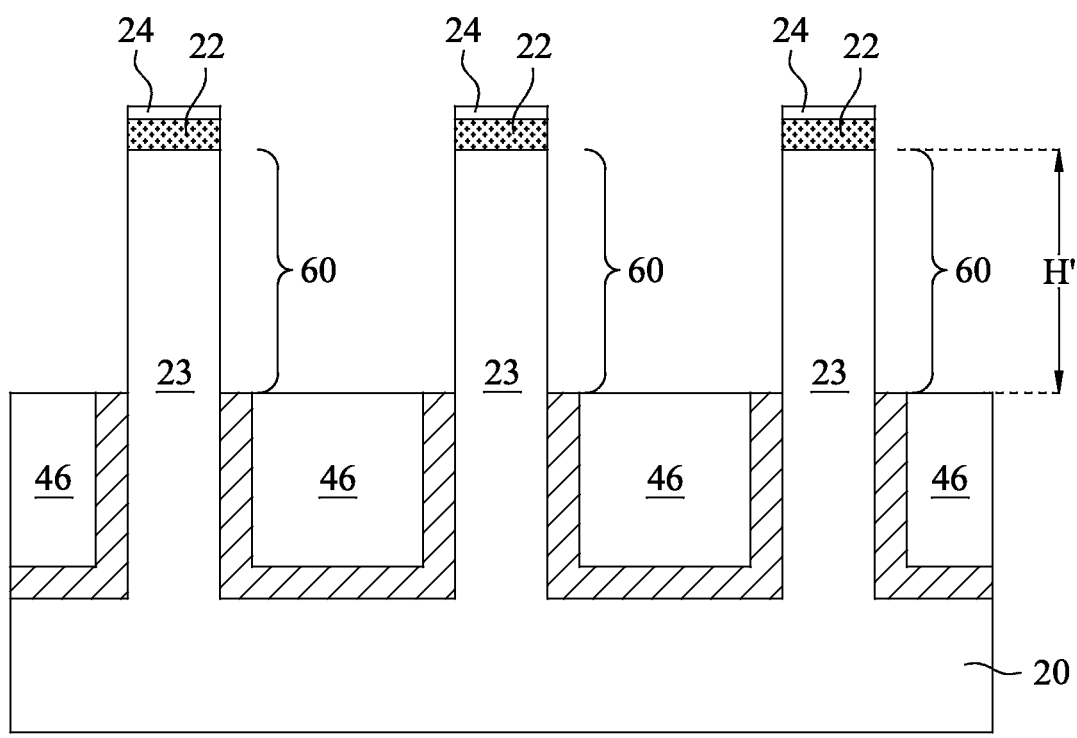

Next, the structure shown in FIGS. 5A and 5B may be used to form the fins of a FinFET or FinFETs. The resulting structures are shown in FIGS. 6A and 6B, respectively, wherein the structure shown in FIG. 6A is obtained from the structure shown in FIG. 5A, and the structure shown in FIG. 6B is obtained from the structure shown in FIG. 5B. As shown in FIGS. 6A and 6B, STI regions 46 are recessed in an etching step. The portions of semiconductor substrate 20 protruding over the top surfaces of the remaining STI regions 46 thus become fins 60. Height H' of fins 60 may be between 15 nm and about 50 nm, although height H' may be greater or smaller. In the embodiments shown in FIG. 6A, the exposed portions of layer 36 may be left without being removed. In alternative embodiments, the exposed portions of layer 36 are removed, as shown in FIG. 6C. In the embodiments shown in FIG. 6B, an additional stripping step may be performed to remove exposed portions of layer 38.

In the embodiments, by performing the plasma treatment, the property of the surfaces of mask layer 24 and semiconductor substrate 20 are modified. Referring back to FIGS. 5A and 5B, portions 46A are the portions (of STI regions 46) close to mask layer 24, while portions 46B are the portions (of STI regions 46) close to substrate strips 23. Experiment results indicated that by performing the plasma treatment, portions 46A and 46B of STI regions 46 may have a more uniform property compared to the STI regions formed without the plasma treatment. For example, the etching rates of portions 46A and 46B are closer to each other. Accordingly, in the subsequent etching step as shown in FIGS. 6A and 6B, it is easy to control the etching process.

Figure 7A:
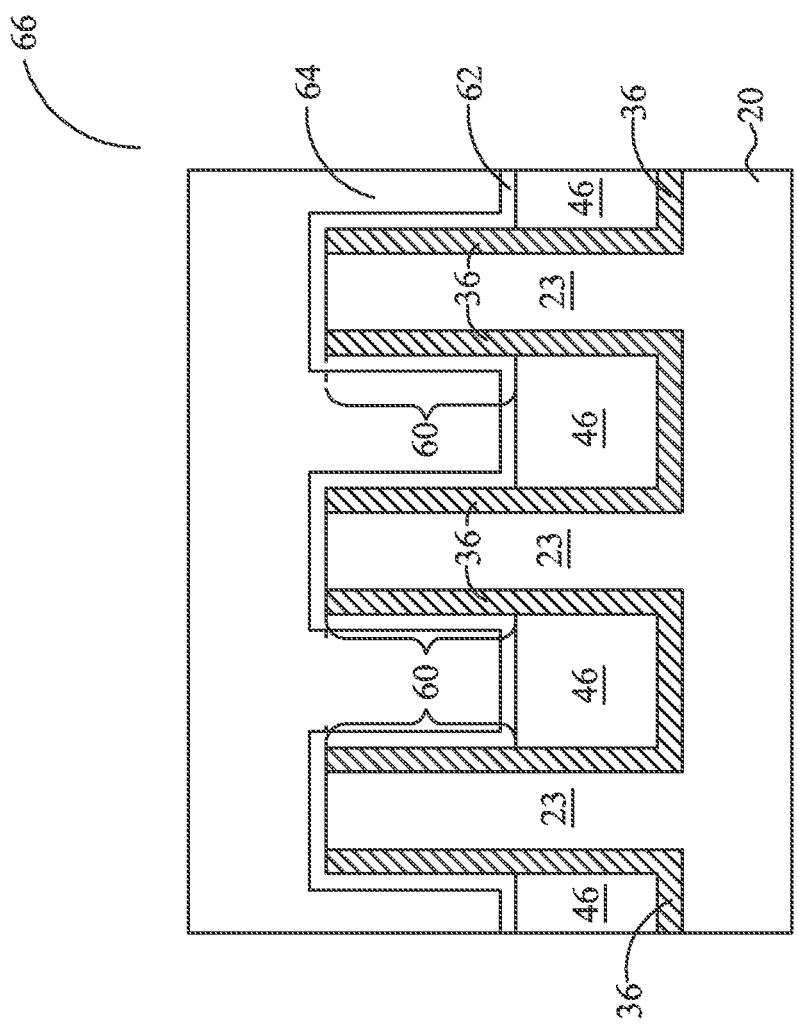
Figure 7B:
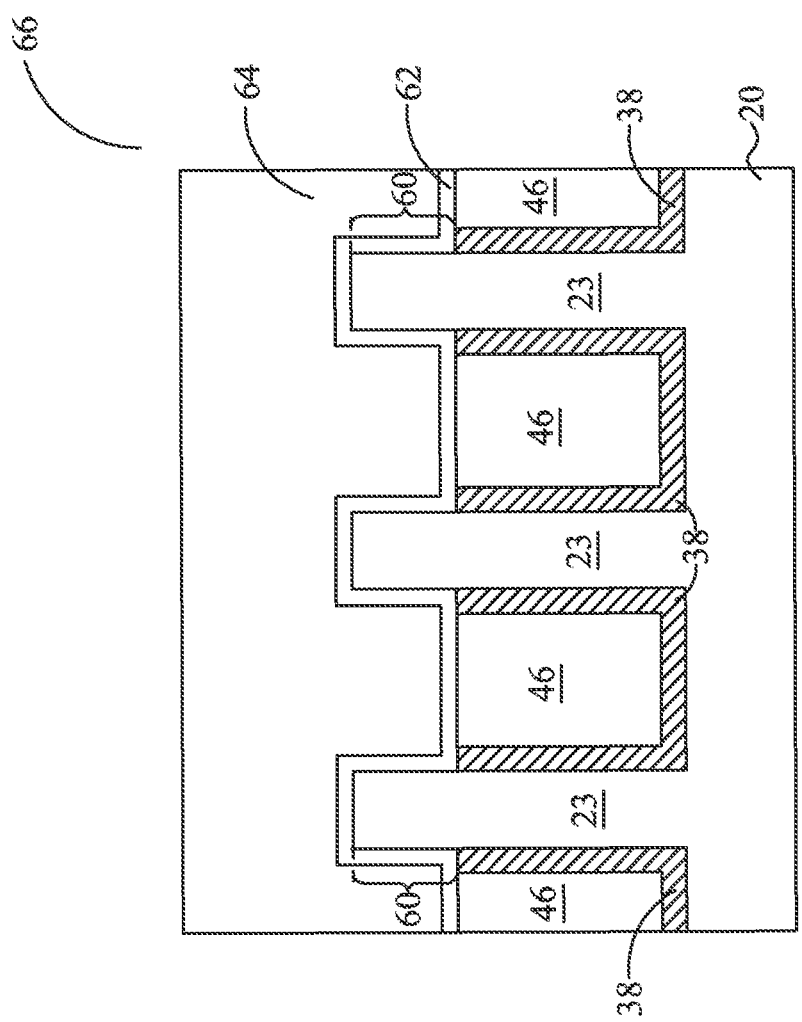

In accordance with some embodiments, mask layer 24 and pad layer 22 are removed. The resulting structure is shown in FIGS. 7A and 7B. Mask layer 24, if formed of silicon nitride, may be removed by a wet process using hot $H_3PO_4$. Pad layer 22 may be removed using diluted HF acid when it formed of silicon oxide. In alternative embodiments, the removal of mask layer 24 and pad layer 22 may be performed after the CMP step as shown in FIGS. 5A and 5B, and before the recessing of STI regions 46, which recessing step is shown in FIGS. 6A and 6B.

Figure 7C:
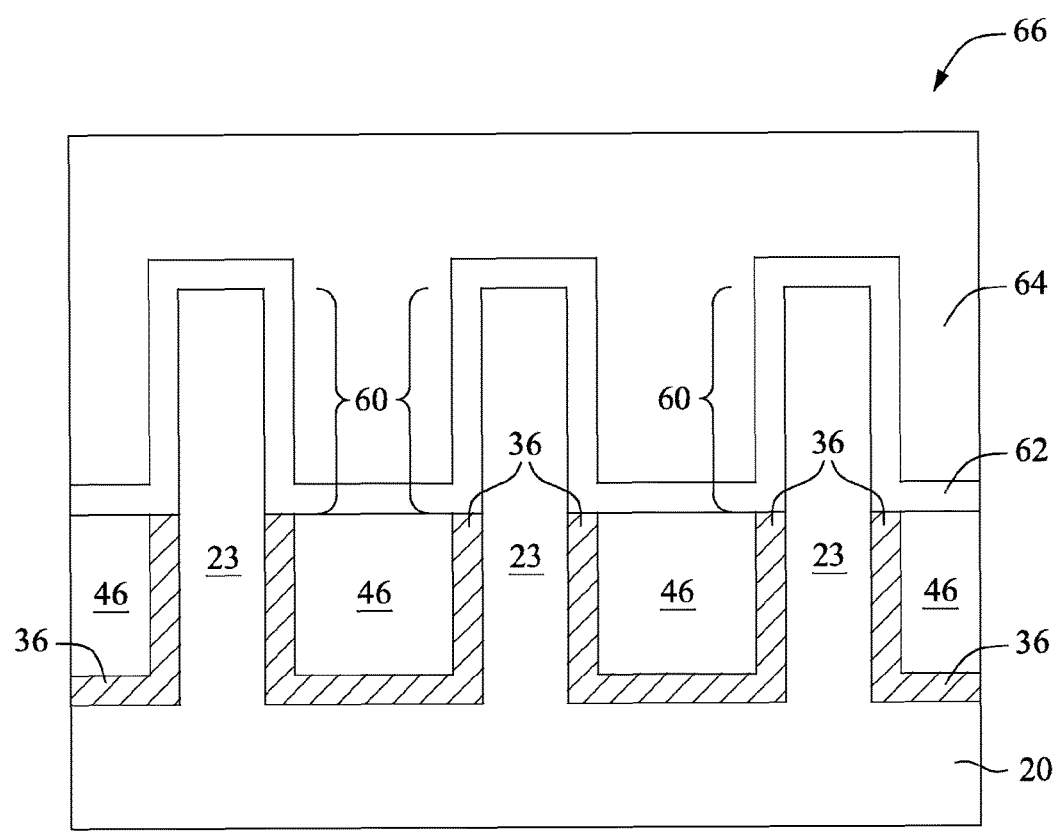

FIGS. 7A, 7B and 7C illustrate FinFETs 66 formed from the structures shown in FIGS. 6A, 6B and 6C, respectively. In each of FIGS. 7A, 7B, and 7C gate dielectric 62 is formed to cover the top surfaces and sidewalls of fins 60. Gate dielectric 62 may be formed by a thermal oxidation, and hence may include thermal silicon oxide. In these embodiments, gate dielectric 62 is formed on the top surfaces of fins 60, but not on some top surfaces of STI regions 46. Alternatively, Gate dielectric 62 may be formed through a deposition step, and may be formed of high-k materials. Accordingly, gate dielectric 62 is formed on the top surfaces of fins 60 and the top surfaces of STI regions 46. In some embodiments, gate electrode 64 covers more than one fin 60, so that the resulting FinFET 66 comprises more than one fin 60. In alternative embodiments, each of fins 60 may be used to form one FinFET. The remaining components of the FinFET 66, including source and drain regions and source and drain silicide regions (not shown), are then formed. The formation processes of these components are known in the art, and hence are not repeated herein.

In the embodiments, by performing plasma treatments on the surfaces of different materials, such as mask layer 24 and substrate 20 in FIGS. 3A and 3B, the surface property of the materials may be modified. This in turn affects the formation of the subsequently formed material that is formed on the surface of the different materials. The portions of the deposited material on different surfaces hence have more uniform properties.

In accordance with embodiments, a method includes performing a plasma treatment on a first surface of a first material and a second surface of a second material, wherein the first material is different from the second material. A third material is formed on treated first surface of the first material and on treated second surface of the second material. The first, the second, and the third materials may include a hard mask, a semiconductor material, and an oxide, respectively.

In accordance with other embodiments, a method includes forming a mask layer over a semiconductor substrate, patterning the mask layer and the semiconductor substrate to form a trench extending into the mask layer and the semiconductor substrate, and performing a plasma treatment on the mask layer and the semiconductor substrate to form a layer. The plasma treatment is performed by generating a plasma from a process gas, wherein ions of the process gas comprises first portions attracted to a bottom of the trench and second portions attracted to a sidewall of the trench to form the layer. The formed layer includes a first portion at the bottom of the trench and comprising the ions, and a second portion on the sidewall of the trench and comprising the ions. The first portion and the second portion of the layer have substantially a same thickness.

In accordance with yet other embodiments, a method includes providing a semiconductor substrate, forming a mask layer over the semiconductor substrate, and patterning the mask layer and the semiconductor substrate to form two trenches, wherein a portion of the semiconductor substrate and a portion of the mask layer are located between the two trenches. The method further includes performing a plasma treatment on a first surface of the portion of the mask layer and a second surface of the portion of the semiconductor substrate. The first surface and the second surface are sidewall surfaces facing one of the two trenches. After the plasma treatment, a dielectric material is deposited into the two trenches. A FinFET may then be formed a fin formed of the portion of the semiconductor substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
performing a plasma treatment on a first surface of a first material and a second surface of a second material, wherein the second material comprises a semiconductor material, and the first material is different from the second material, wherein a first surface layer of the first material and a second surface layer of the second material are both treated during the plasma treatment;
forming a third material on treated first surface of the first material and on treated second surface of the second material, wherein the third material comprises a dielectric material;
removing the first material;
recessing the third material, wherein a portion of the second material protrudes over a top surface of remaining portions of the third material to form a semiconductor fin, wherein the second surface layer comprises a portion over the top surface of remaining portions of the third material; and
forming a dielectric layer on a sidewall of the semiconductor fin, and the portion of the second surface layer is between the dielectric layer and the semiconductor fin, wherein a lower portion of the second surface layer remains after the dielectric layer is formed.

2. The method of claim 1, wherein the first material comprises silicon nitride, and the second material comprises crystalline silicon.

3. The method of claim 1, wherein the third material comprises silicon oxide.

4. The method of claim 1, wherein the plasma treatment is isotropic, wherein the second surface of the second material comprises a first surface portion and a second surface portion perpendicular to the first surface portion, wherein ions of a process gas of the plasma treatment are attracted to the first and the second surface portions, and neither a first movement of the ions to the first surface portion and a second movement of the ions to the second surface portion dominates.

5. The method of claim 1 further comprising:
   forming a mask layer over a semiconductor substrate, wherein the mask layer comprises the first material, and the semiconductor substrate comprises the second material;
   etching the mask layer and the semiconductor substrate to form a trench, wherein the plasma treatment is performed on exposed surfaces of the mask layer and the semiconductor substrate, and wherein the exposed surfaces are in the trench;
   performing the step of forming the third material, wherein the third material comprises a dielectric material; and
   performing a Chemical Mechanical Polish (CMP) to remove an excess portion of the third material over the mask layer.

6. The method of claim 1, wherein the plasma treatment is performed using a process gas selected from the group consisting essentially of $CH_4$, $N_2$, $N_2O$, $NH_3$, $NF_3$, $O_2$, $H_2$, $BF_3$, $B_2H_6$, $PH_3$, $AsH_3$, and combinations thereof.

7. The method of claim 1, wherein the plasma treatment comprises implanting ions into the first surface layer and the second surface layer.

8. The method of claim 1 further comprising, before the dielectric layer is formed, removing an upper portion of the second surface layer over the top surface of remaining portions of the third material, wherein the lower portion of the second surface layer remains after the upper portion is removed.

9. The method of claim 8, wherein the upper portion of the second surface layer is in contact with a sidewall of an inner portion of the second material before the upper portion is removed, with the sidewall of the inner portion exposed after the upper portion is removed, and the dielectric layer is in physical contact with the sidewall of the inner portion of the second material.

10. A method comprising:
    performing a plasma treatment on a first surface of a first material and a second surface of a second material, wherein the second material comprises a semiconductor material, and the first material is different from the second material, wherein a first surface layer of the first material and a second surface layer of the second material are both treated during the plasma treatment, and the plasma treatment comprises implanting ions into the first surface layer and the second surface layer, and wherein the first material and the second material are formed of a dielectric material and a semiconductor material, respectively;
    forming a third material on treated first surface of the first material and on treated second surface of the second material, wherein the third material comprises a dielectric material;
    removing the first material;
    recessing the third material, wherein a portion of the second material protrudes over a top surface of remaining portions of the third material to form a semiconductor fin, wherein the second surface layer comprises a portion over the top surface of remaining portions of the third material; and
    forming a dielectric layer on a sidewall of the semiconductor fin, and the portion of the second surface layer is between the dielectric layer and the semiconductor fin, wherein a lower portion of the second surface layer remains after the dielectric layer is formed.

11. The method of claim 10, wherein the first material comprises silicon nitride, and the second material comprises crystalline silicon.

12. The method of claim 10, wherein the third material comprises silicon oxide.

13. The method of claim 10, wherein the plasma treatment is isotropic, wherein the second surface of the second material comprises a first surface portion and a second surface portion perpendicular to the first surface portion, wherein ions of a process gas of the plasma treatment are attracted to the first and the second surface portions, and neither a first movement of the ions to the first surface portion and a second movement of the ions to the second surface portion dominates.

14. The method of claim 10 further comprising:
    forming a mask layer over a semiconductor substrate, wherein the mask layer comprises the first material, and the semiconductor substrate comprises the second material;
    etching the mask layer and the semiconductor substrate to form a trench, wherein the plasma treatment is performed on exposed surfaces of the mask layer and the semiconductor substrate, and wherein the exposed surfaces are in the trench;
    performing the step of forming the third material, wherein the third material comprises a dielectric material; and
    performing a Chemical Mechanical Polish (CMP) to remove an excess portion of the third material over the mask layer.

15. The method of claim 10, wherein the plasma treatment is performed using a process gas selected from the group consisting essentially of $CH_4$, $N_2$, $N_2O$, $NH_3$, $NF_3$, $O_2$, $H_2$, $BF_3$, $B_2H_6$, $PH_3$, $AsH_3$, and combinations thereof.

16. The method of claim 10 further comprising, before the dielectric layer is formed, removing an upper portion of the second surface layer over the top surface of remaining portions of the third material, wherein the lower portion of the second surface layer remains after the upper portion is removed.

17. The method of claim 16, wherein the upper portion of the second surface layer is in contact with a sidewall of an inner portion of the second material before the upper portion is removed, with the sidewall of the inner portion exposed after the upper portion is removed, and the dielectric layer is in physical contact with the sidewall of the inner portion of the second material.

* * * * *